United States Patent [19]

Tsukahara

[11] Patent Number: 5,592,108
[45] Date of Patent: Jan. 7, 1997

[54] INTERFACE CIRCUIT ADAPTED FOR CONNECTION TO FOLLOWING CIRCUIT USING METAL-SEMICONDUCTOR TYPE TRANSISTOR

[75] Inventor: Kazuhisa Tsukahara, Yamanashi, Japan

[73] Assignee: Fujitsu Limited, Kawasaki, Japan

[21] Appl. No.: 506,638

[22] Filed: Jul. 25, 1995

[30] Foreign Application Priority Data

Jan. 20, 1995 [JP] Japan .................... 7-007500

[51] Int. Cl.$^6$ .............................. H03K 19/0175
[52] U.S. Cl. ................ 326/69; 326/68; 326/116; 326/117
[58] Field of Search ............... 326/68, 69, 116, 326/117

[56] References Cited

U.S. PATENT DOCUMENTS

| | | | |
|---|---|---|---|
| 4,853,561 | 8/1989 | Gravok | 326/117 |
| 4,912,745 | 3/1990 | Fitzpatrick | 326/117 |
| 4,968,904 | 11/1990 | Yamashita | 326/116 |
| 5,045,727 | 9/1991 | Danckaert et al. | 326/68 |
| 5,051,626 | 9/1991 | Kajii | 326/69 |

FOREIGN PATENT DOCUMENTS 62-113480  5/1987  Japan.

*Primary Examiner*—Edward P. Westin
*Assistant Examiner*—Andrew Sanders
*Attorney, Agent, or Firm*—Armstrong, Westerman, Hattori, McLeland & Naughton

[57] ABSTRACT

An interface circuit includes an input current limiting circuit for limiting a current of an input signal fed from a preceding circuit, thereby outputting the current-limited signal to a following circuit which is constituted using a MES type transistor. The interface circuit also includes a level shifting circuit supplied with a first higher power supply voltage and a lower power supply voltage, for converting a level of the current-limited signal into a logic level of the following circuit which is supplied with a second higher power supply voltage. The interface circuit further includes a level judging circuit connected between the input current limiting circuit and the level shifting circuit, for judging a logic threshold level of the input signal based on a predetermined level reference voltage. By the constitution, it is possible to adapt the interface circuit for connection to the following circuit constituted using MES type transistors.

14 Claims, 4 Drawing Sheets

INTERFACE CIRCUIT ADAPTED FOR CONNECTION TO FOLLOWING CIRCUIT USING METAL-SEMICONDUCTOR TYPE TRANSISTOR

BACKGROUND OF THE INVENTION

1. Field of the Invention

The present invention relates to an interface circuit. More particularly, it relates to an interface circuit such as a level conversion circuit adapted for connection to a following circuit which is constituted using metal-semiconductor (MES) type transistors, e.g., field-effect transistors (FETs) formed by compound semiconductors such as gallium arsenide (GaAs).

2. Description of the Related Art

In recent years, integrated circuits using compound semiconductors such as GaAs have been widely used, with an improvement in the degree of integration thereof, in fields where high speed operation and low power dissipation are required. In this case, such a compound semiconductor integrated circuit must be matched with a typical integrated circuit such as a transistor-transistor-logic (TTL) integrated circuit which has been conventionally used. To this end, in a GaAs integrated circuit or the like, it is necessary to provide at an input interface thereof a level conversion circuit for converting an input signal (in this case, TTL level input signal) to the logic level of an internal circuit therein.

For example, as the prior art related to such a level conversion, a technique of converting a TTL level input signal into a complementary metal oxide semiconductor (CMOS) level signal is known. In this case, in an input interface portion of the CMOS integrated circuit, there is provided a level conversion circuit for converting an input signal into a CMOS level signal needed for an internal circuit therein.

Such a CMOS integrated circuit is typically formed via an insulator such as silicon dioxide ($SiO_2$) on a monolithic semiconductor substrate such as silicon (Si). Accordingly, the structure of each transistor formed on the semiconductor substrate is of a MOS type FET.

On the other hand, in the state of the art, in a compound semiconductor integrated circuit such as a GaAs integrated circuit, an insulator such as $SiO_2$ as seen in a general CMOS integrated circuit is not put to practical use. Accordingly, the structure of each transistor formed on the compound semiconductor substrate is of a MES type FET.

Namely, in CMOS integrated circuits, there is a gate-insulating film between the gate electrode of each FET and a corresponding channel region in the substrate. As a result, no current flows between the gate electrode and a corresponding source (or drain) region in the substrate. Contrary to this, in compound semiconductor (e.g., GaAs) integrated circuits, each FET has a structure where its gate electrode is Schottky-contacted with the compound semiconductor. As a result, a current path is formed between the gate electrode and a corresponding source (or drain) region in the substrate.

According to the above state of the art, a problem occurs in the case where a preceding circuit is constituted using a current-drive type transistor such as a bipolar transistor and a following circuit is constituted using a MES type FET. Namely, as described above, a current path is formed between the gate and the source (or drain) of the MES type FET in the following circuit. In this state, when the MES type FET is directly connected to an output stage of the preceding circuit, a problem occurs in that a current to be treated as a logic signal in the preceding circuit is absorbed by the current path formed in the following circuit all the time. In other words, a current leak occurs, and thus a problem occurs in that it is impossible for the preceding circuit to normally drive the following circuit.

In this case, if the following circuit is constituted using a MOS type FET, the above problem would not occur since no current path is formed by presence of the above gate-insulating film.

SUMMARY OF THE INVENTION

An object of the present invention is to provide an interface circuit which can be adapted for connection to a following circuit constituted using MES type transistors.

Another object of the present invention is to provide a semiconductor integrated circuit into which the above interface circuit is incorporated.

According to a first aspect of the present invention, there is provided an interface circuit including an input current limiting circuit for limiting a current of an input signal fed from a preceding circuit, thereby outputting the current-limited signal to a following circuit which is constituted using a MES type transistor.

According to a second aspect of the present invention, there is provided a semiconductor integrated circuit including an internal circuit constituted using at least one MES type transistor, and an interface circuit for transmitting an input signal to the internal circuit, the interface circuit including means for limiting a current of the input signal and outputting the current-limited signal to the internal circuit.

BRIEF DESCRIPTION OF THE DRAWINGS

Other objects and features of the present invention will be described hereinafter in detail by way of preferred embodiments with reference to the accompanying drawings, in which.

DESCRIPTION OF THE PREFERRED EMBODIMENTS

Figure 1:
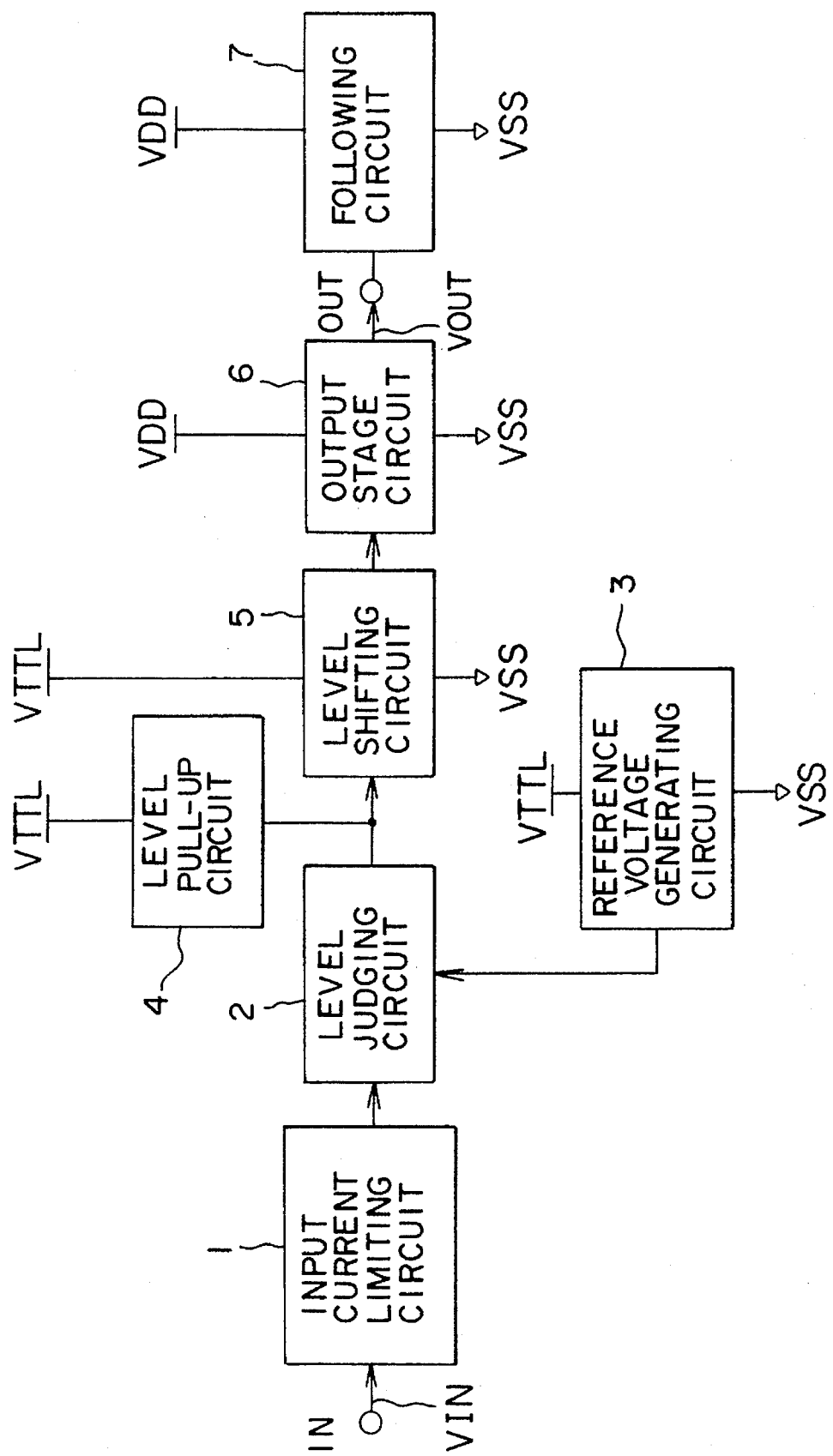
FIG. 1 is a block diagram showing the fundamental constitution of the interface circuit according to the present invention.

FIG. 1 illustrates the fundamental constitution of the interface circuit according to the present invention.

First, the interface circuit includes an input current limiting circuit 1 for limiting a current of an input signal VIN fed from a preceding circuit (not shown), and thereby outputs the current-limited signal to a following circuit 7 which is constituted using a MES type transistor.

Also, the interface circuit includes a level shifting circuit 5 which is supplied with a first higher power supply voltage VTTL and a lower power supply voltage VSS, and converts a level of the current-limited signal into a logic level of the following circuit 7 that is supplied with a second higher power supply voltage VDD.

The interface circuit further includes a level judging circuit 2 which is connected between the input current limiting circuit 1 and the level shifting circuit 5, and judges a logic threshold level of the input signal based on a predetermined level reference voltage.

The interface circuit further includes a reference voltage generating circuit 3 which feeds the predetermined level reference voltage to the level judging circuit 2.

The interface circuit further includes an output stage circuit 6 which is supplied with the second higher power supply voltage VDD and the lower power supply voltage VSS, and converts an output signal of the level shifting circuit 5 into a logic level signal VOUT needed for the following circuit 7.

The interface circuit further includes a level pull-up circuit 4 which is connected between a line of the first higher power supply voltage VTTL and an output end of the level judging circuit 2.

According to the constitution of the interface circuit according to the present invention, before the input signal VIN from the preceding circuit is input to the following circuit 7 which is constituted using a MES type FET, it is possible to reduce a current flowing through a current path formed in the MES type FET, based on the working of the input current limiting circuit 1.

Thus, it is possible to normally maintain the value of a current to be treated as a logic signal in the preceding circuit. This leads to a solution of the problem as explained in the aforementioned "Related Art".

Next, a preferred embodiment of the present invention is explained with reference to FIGS. 2 to 4.

Figure 2:
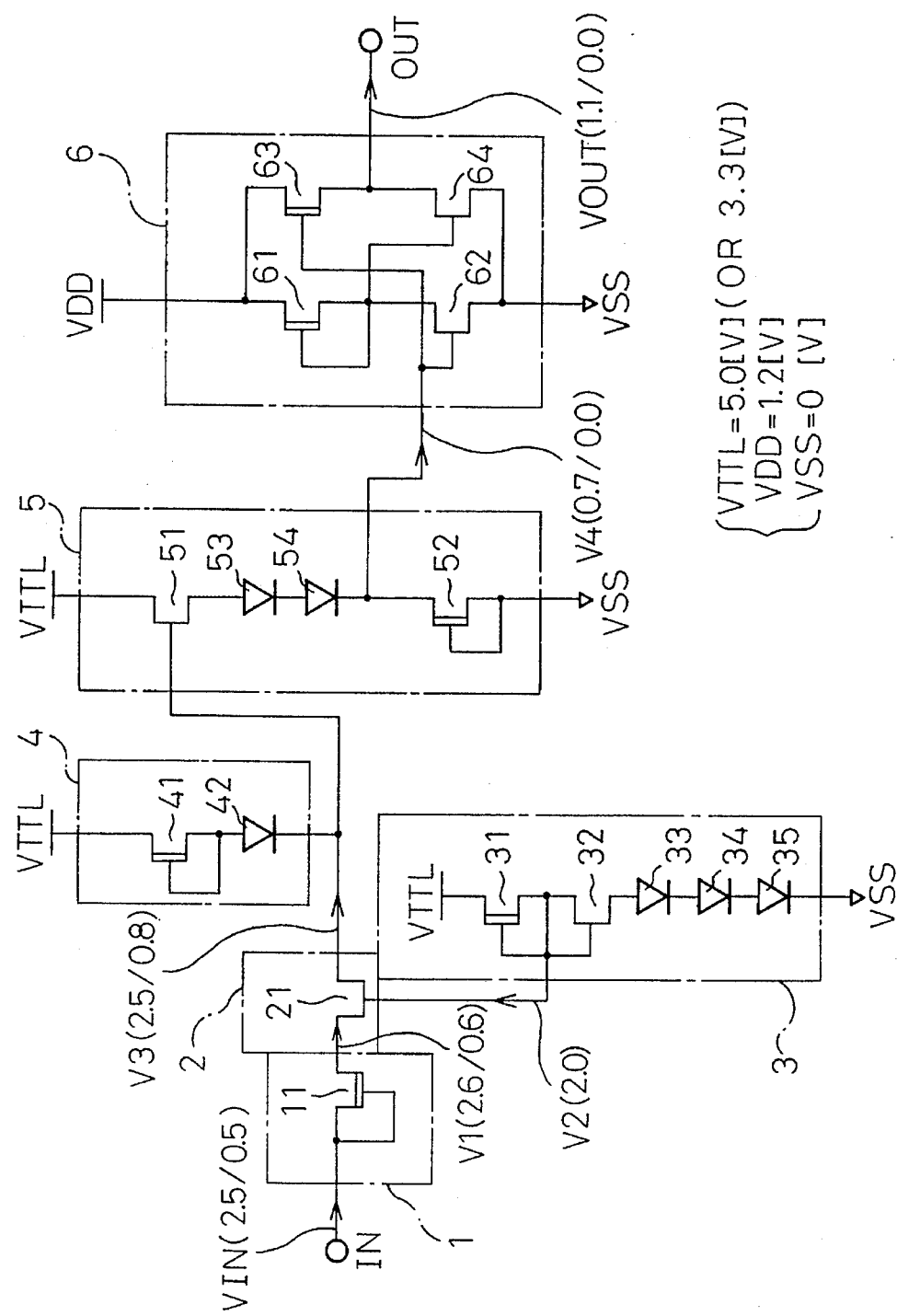
FIG. 2 is a circuit diagram showing the constitution of an input interface circuit provided in a GaAs integrated circuit, according to an embodiment of the present invention.

FIG. 2 illustrates the constitution of an input interface circuit provided in a GaAs integrated circuit, according to an embodiment of the present invention.

The illustrated circuit has the function of converting a TTL level input logic signal into a GaAs level logic signal and then feeding the converted GaAs level logic signal to the following circuit, i.e., an internal circuit of the GaAs integrated circuit. Note that the same references as those shown in FIG. 1 indicate like constituent elements.

First, the input current limiting circuit 1 is constituted by a depletion MESFET 11 having a source connected to an input end IN for receiving the TTL level input logic signal VIN, and a gate connected to the source. The input current limiting circuit 1 has the function of limiting an input current of the TTL level input logic signal VIN.

Also, the level judging circuit 2 is constituted by an enhancement MESFET 21 having a source connected to an output end of the input current limiting circuit 1 (i.e., a drain of the MESFET 11), and responsive to a reference voltage V2 fed from the reference voltage generating circuit 3. The level judging circuit 2 has the function of judging a logic threshold level of a TTL level logic signal V1 input through the input current limiting circuit 1. Namely, when the TTL level input logic signal is at "H" level, the MESFET 21 is turned OFF, and when the TTL level input logic signal is at "L" level, the MESFET 21 is turned ON.

Also, the reference voltage generating circuit 3 is constituted by a depletion MESFET 31 having a drain connected to a higher voltage power supply line VTTL, and a gate connected to its source; an enhancement MESFET 32 having a drain connected to the source of the MESFET 31, and a gate connected to the drain; and three diodes 33 to 35 connected in series in the forward direction between the source of the MESFET 32 and a lower voltage power supply line VSS. The reference voltage V2 is output from the drain of the MESFET 32.

Also, the level pull-up circuit 4 is constituted by a depletion MESFET 41 having a drain connected to the power supply line VTTL, and a gate connected to its source; and a diode 42 connected in the forward direction between the source of the MESFET 41 and an output end of the level judging circuit 2 (i.e., a drain of the MESFET 21). The level pull-up circuit 4 has the function of pulling up a level of the drain voltage V3 of the MESFET 21 when the TTL level input logic signal is at "H" level, and feeding current via the MESFETs 21 and 11 to the input end IN when the TTL level input logic signal is at "L" level.

Also, the level shifting circuit 5 is constituted by an enhancement MESFET 51 having a drain connected to the power supply line VTTL, and responsive to the drain voltage V3 of the MESFET 21; a depletion MESFET 52 having a source connected to the power supply line VSS, and a gate connected to the source; and two diodes 53 and 54 connected in series in the forward direction between a source of the MESFET 51 and a drain of the MESFET 52. An output signal V4 of the level shifting circuit 5 is obtained from a cathode of the diode 54. The level shifting circuit 5 has the function of shifting a level of the output voltage of the level judging circuit 2, so as to be matched with an input voltage level of the following output stage circuit 6.

Also, the output stage circuit 6 is constituted by a depletion MESFET 61 having a drain connected to a higher voltage power supply line VDD, and a gate connected to its source; an enhancement MESFET 62 connected between the source of the MESFET 61 and the power supply line VSS, and responsive to the output signal V4 of the level shifting circuit 5; a depletion MESFET 63 having a drain connected to the power supply line VDD, and responsive to the output signal V4 of the level shifting circuit 5; and an enhancement MESFET 64 connected between a source of the MESFET 63 and the power supply line VSS, and responsive to a drain voltage of the MESFET 62. A GaAs level output logic signal VOUT is obtained from a drain of the MESFET 64, and output to an output end OUT. The output end OUT is connected to the internal circuit (the following circuit 7 shown in FIG. 1) which is supplied with the same power supply voltage VDD as the output stage circuit 6.

The power supply voltages VTTL, VDD and VSS used in the circuit of the present embodiment are set as follows:

VTTL=5.0 [V] or 3.3 [V]

VDD=1.2 [V]

VSS=0 [V]

Also, in FIG. 2, two values in parentheses added to the signals VIN, V1, V3, V4 and VOUT at respective nodes represent a voltage value obtained when the input signal VIN is at "H" level, and a voltage value obtained when the input signal VIN is at "L" level, respectively, in the case of the power supply voltage VTTL being equal to 5.0 [V]. For example, the drain voltage V3 of the MESFET 21 exhibits 2.5 [V] when the input signal VIN is at "H" level (i.e., 2.5 [V]), and it exhibits 0.8 [V] when the input signal VIN is at "L" level (i.e., 0.5 [V]).

Figure 3:
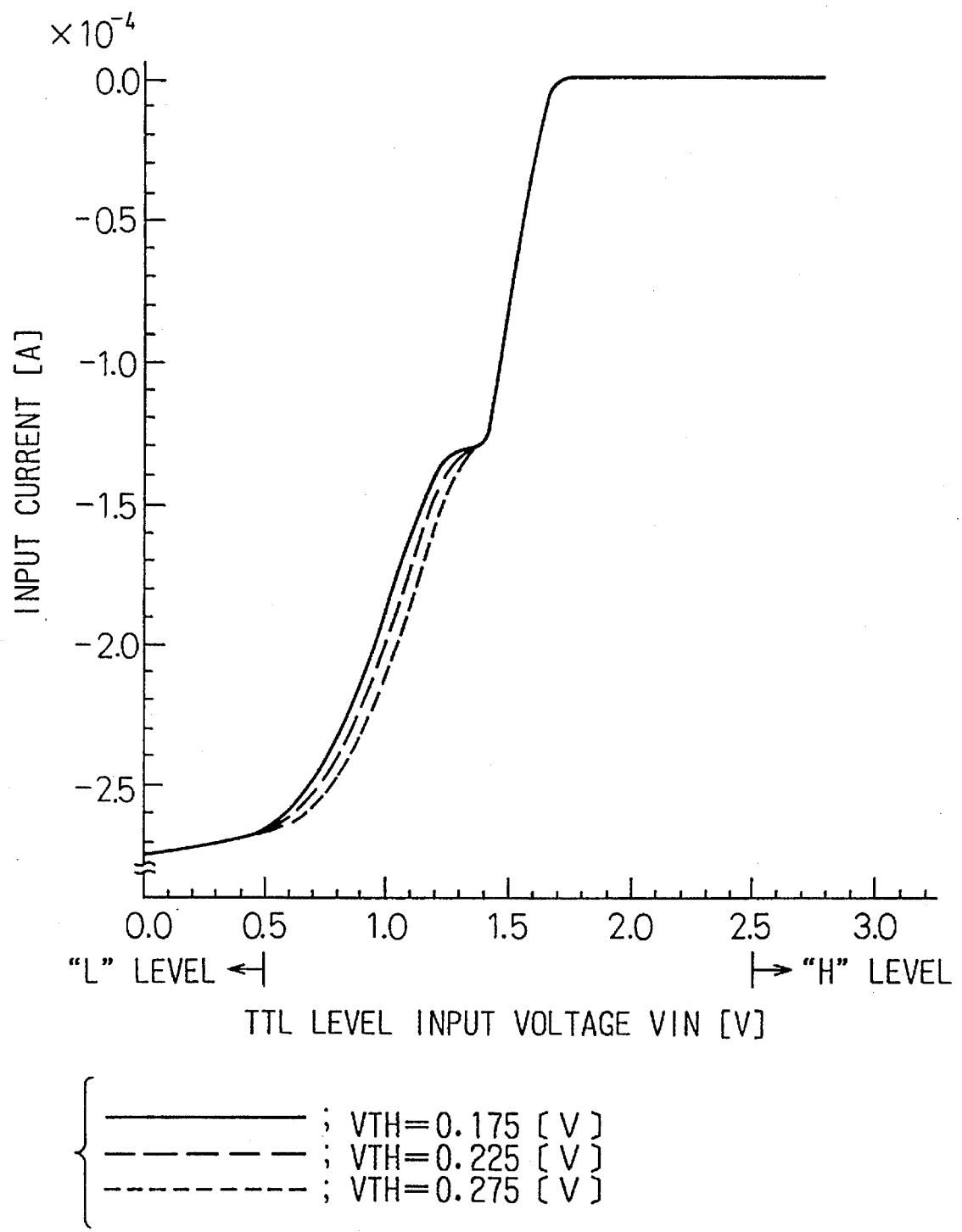
FIG. 3 is a graph showing an operational characteristic (relationship between a TTL level input voltage and an input current) of the circuit shown in FIG. 2.
Figure 4:
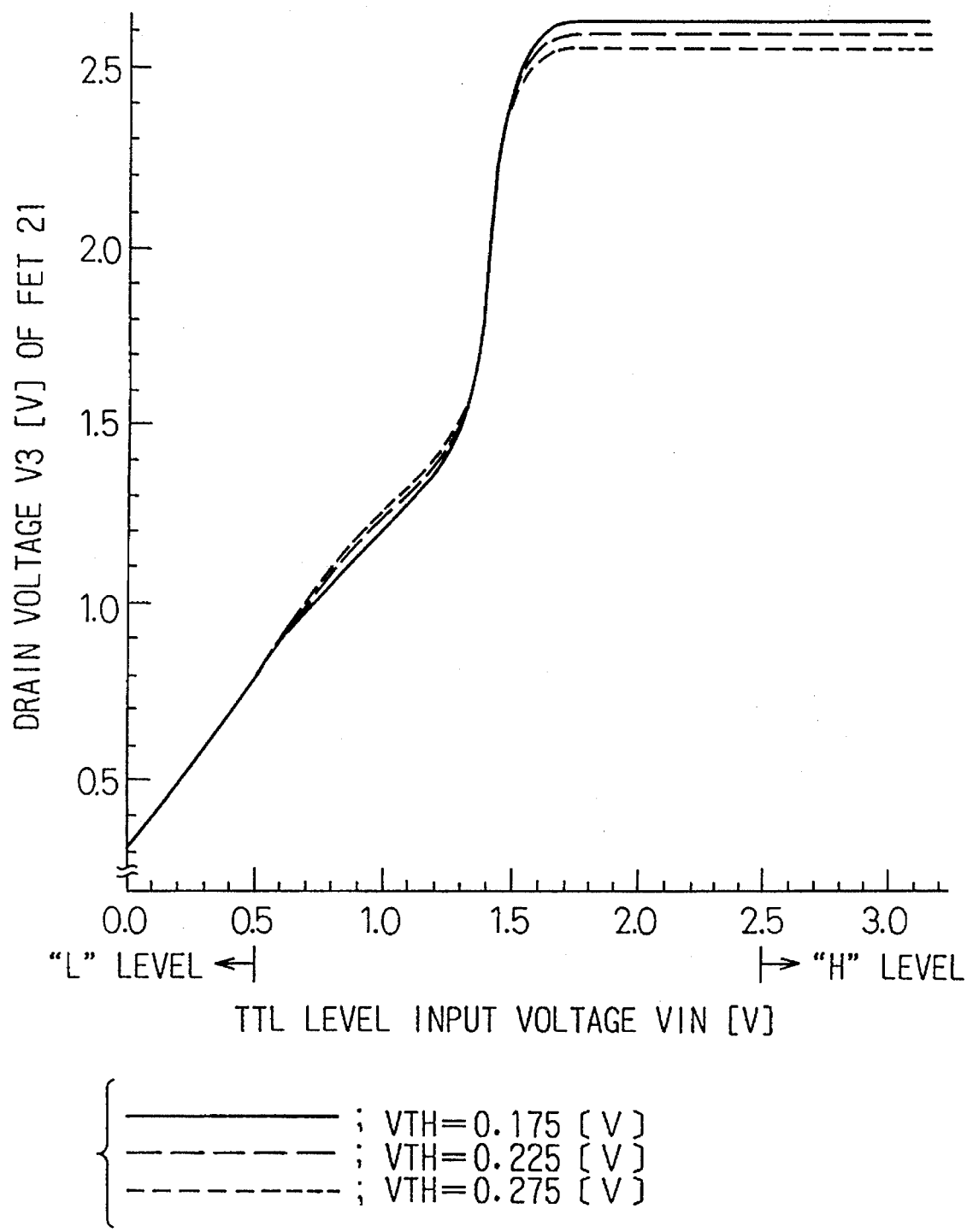
FIG. 4 is a graph showing an operational characteristic (relationship between a TTL level input voltage and a drain voltage $V_3$ of the FET 21) of the circuit shown in FIG. 2.

FIG. 3 shows the relationship between the TTL level input voltage and the input current, and FIG. 4 shows the relationship between the TTL level input voltage and the drain voltage V3 of the FET 21.

The respective curves shown in FIGS. 3 and 4 represent characteristics obtained in the cases where a threshold voltage VTH of the enhancement MESFET is changed as follows:

| Solid line; | VTH = 0.175 [V] |
| Long-broken line; | VTH = 0.225 [V] |
| Short-broken line; | VTH = 0.275 [V] |

In the constitution of the input interface circuit according to the present embodiment, when the TTL level input logic signal VIN is at "H" level (i.e., above 2.5 [V]), the MESFET 21 of the level judging circuit 2 is turned OFF. Accordingly, the input current is 0 [A] (see the characteristic curve shown in FIG. 3).

Then, based on the working of the level pull-up circuit 4, the level of the drain voltage V3 of the MESFET 21 is pulled up (see the characteristic curve shown in FIG. 4). The pulled-up voltage is input as a "H" level logic signal to the gate of the MESFET 51 of the level shifting circuit 5. In response to the "H" level logic signal, the level shifting circuit 5 carries out its level-shift processing. Then, the level-shifted signal is converted by the following output stage circuit 6 into a GaAs level logic signal VOUT of "H" level.

On the other hand, when the TTL level input logic signal VIN is at "L" level (i.e., below 0.5 [V]), the MESFET 21 of the level judging circuit 2 is turned ON. As a result, currents flow from each power supply line VTTL in the level pull-up circuit 4 and the reference voltage generating circuit 3 via the MESFETs 21 and 11 to the input end IN. Namely, the input current of negative polarity flows (see the characteristic curve shown in FIG. 3).

Accordingly, the level of the drain voltage V3 of the MESFET 21 is brought to "L" level (see the characteristic curve shown in FIG. 4), and then the "L" level signal is input to the gate of the MESFET 51 of the level shifting circuit 5. Thereafter, in the same manner as the above, the level shifting circuit 5 and the output stage circuit 6 cooperate so as to output a GaAs level logic signal VOUT of "L" level.

Thus, according to the input interface circuit of the present embodiment, it is possible to effectively suppress the input current of the TTL level input logic signal VIN based on the working of the input current limiting circuit 1.

Also, the voltage level of a TTL level logic signal input through the input current limiting circuit 1 is shifted by the level shifting circuit 5, so as to be matched with the input voltage level of the output stage circuit 6 which is supplied with the same power supply voltage VDD as the internal circuit. Accordingly, it is possible to satisfactorily convert the TTL level input logic signal VIN into a GaAs level logic signal necessary for the internal circuit.

Also, in the reference voltage generating circuit 3, the enhancement MESFET 32 has the function of carrying out a level-shifting as in the diodes 33 to 35. Accordingly, even if there is an error or deviation in the threshold voltage of the MESFET 21, the reference voltage generating circuit 3 can cause its output level V2 to follow the error or deviation in the threshold voltage with the aid of the level-shifting function of the MESFET 32. Namely, with respect to the error or deviation in the threshold voltage of the MESFET 21 due to its production process, it is possible to supply the gate of the MESFET 21 with the reference voltage V2 having a stable level. This contributes to an improvement in the performance of the reference voltage generating circuit 3.

Also, the output stage circuit 6 is driven by the same power supply voltage VDD as the following internal circuit, and the MESFETs 61 to 64 constituting the circuit 6 are connected in a push-pull configuration. Accordingly, even if there is a fluctuation in the power supply voltage VDD, the output stage circuit 6 can follow the fluctuation. Namely, based on the working of the output stage circuit 6, the entire input interface circuit can follow the fluctuation in the power supply voltage VDD. In other words, it is possible to realize a stable TTL/GaAs level conversion with respect to the fluctuation in the power supply voltage VDD.

Although, in the present embodiment, the MESFET 11 constituting the input current limiting circuit 1 and the MESFET 21 constituting the level judging circuit 2 are provided separately, both circuits may be constituted so as to share an identical MESFET with each other.

Also, although the present embodiment has been explained concerning the case where the power supply voltage VTTL of 5.0 [V] or 3.3 [V] is used, it is of course possible that both of the voltage values may be used in combination. In this case, it is necessary to suitably change the number of diodes or MESFETs to be used as level-shifting means.

What is claimed is:

1. An interface circuit comprising:
   an input current limiting circuit for limiting a current of an input signal fed from a preceding circuit, thereby outputting the current-limited signal to a following circuit which is constituted using an MES type transistor;
   a level shifting circuit supplied with a first higher power supply voltage and a lower power supply voltage, for converting a level of said current-limited signal into a logic level of said following circuit which is supplied with a second higher power supply voltage; and
   a level judging circuit connected between said input current limiting circuit and said level shifting circuit, for judging a logic threshold level of said input signal based on a predetermined level reference voltage.

2. The interface circuit as set forth in claim 1, wherein said level judging circuit includes an enhancement MES type transistor having a source connected to an output end of said input current limiting circuit and responsive to said predetermined level reference voltage.

3. The interface circuit as set forth in claim 2, further comprising a reference voltage generating circuit for feeding said predetermined level reference voltage to a gate of said enhancement MES type transistor.

4. The interface circuit as set forth in claim 3, wherein said predetermined level reference voltage is set to a voltage level such that said enhancement MES type transistor is turned OFF when said input signal is at logically "H" level, and such that said enhancement MES type transistor is turned ON when said input signal is at logically "L" level.

5. The interface circuit as set forth in claim 4, wherein said reference voltage generating circuit includes a depletion MES type transistor having a drain connected to a line of said first higher power supply voltage and having a gate connected to a source thereof, and an enhancement MES type transistor having a drain connected to the source of said depletion MES type transistor and having a gate connected to the drain thereof, said predetermined level reference voltage being obtained from the drain of said enhancement MES type transistor.

6. The interface circuit as set forth in claim 5, wherein said reference voltage generating circuit further includes a level shifting means connected between a source of said enhancement MES type transistor and a line of said lower power supply voltage.

7. The interface circuit as set forth in claim 1, further comprising an output stage circuit supplied with said second higher power supply voltage and said lower power supply voltage, for converting an output signal of said level shifting circuit into a logic level signal needed for said following circuit.

8. The interface circuit as set forth in claim 7, wherein said output stage circuit includes enhancement MES type transistors and depletion MES type transistors connected in a push-pull configuration.

9. The interface circuit as set forth in claim 1, further comprising a level pull-up circuit connected between a line of said first higher power supply voltage and an output end of said level judging circuit.

10. The interface circuit as set forth in claim 9, wherein said level pull-up circuit includes a depletion MES type transistor having a drain connected to the line of said first higher power supply voltage and having a gate connected to a source thereof, and a level shifting means connected between the source of said depletion MES type transistor and the output end of said level judging circuit.

11. The interface circuit as set forth in claim 1, wherein said MES type transistor is a field-effect transistor formed by compound semiconductor.

12. The interface circuit as set forth in claim 1, wherein said preceding circuit is constituted using a current-drive type transistor.

13. A semiconductor integrated circuit comprising:

an internal circuit constituted using at least one MES type transistor; and an interface circuit for transmitting an input signal to said internal circuit, the interface circuit including means for limiting a current of said input signal and outputting the current-limited signal to said internal circuit;

wherein said interface circuit comprises means for converting a level of said current-limited signal into a logic level of said internal circuit; and wherein said interface circuit further comprises means for judging a logic threshold level of said current-limited signal based on a predetermined level reference voltage.

14. The semiconductor integrated circuit as set forth in claim 13, further comprising a preceding circuit for providing said input signal, the preceding circuit being constituted using at least one current-drive type transistor.

\* \* \* \* \*